United States Patent [19]
Baliga et al.

[11] Patent Number: 4,569,118
[45] Date of Patent: Feb. 11, 1986

[54] PLANAR GATE TURN-OFF FIELD CONTROLLED THYRISTORS AND PLANAR JUNCTION GATE FIELD EFFECT TRANSISTORS, AND METHOD OF MAKING SAME

[75] Inventors: Bantval J. Baliga, Schenectady, N.Y.; Bruce W. Wessels, Evanston, Ill.

[73] Assignee: General Electric Company, Schenectady, N.Y.

[21] Appl. No.: 630,473

[22] Filed: Jul. 11, 1984

Related U.S. Application Data

[60] Division of Ser. No. 355,005, Mar. 5, 1982, abandoned, which is a continuation-in-part of Ser. No. 863,877, Dec. 23, 1977.

[51] Int. Cl.[4] .......................................... H01L 29/747
[52] U.S. Cl. .................................. 29/571; 29/577 C; 148/175; 148/DIG. 50
[58] Field of Search ................. 29/571, 576 E, 578, 29/577 C; 148/175, 185, DIG. 50, 1.5; 357/22

[56] References Cited

U.S. PATENT DOCUMENTS

| | | | |
|---|---|---|---|
| 3,322,581 | 5/1967 | Hendrickson et al. | 148/175 |
| 3,762,966 | 10/1973 | Engeler et al. | 148/175 |
| 3,855,608 | 12/1974 | George et al. | 148/175 |
| 3,953,879 | 4/1976 | O'Connor-d'Arlach et al. | 357/22 |
| 3,969,746 | 7/1976 | Kendall et al. | 148/175 |
| 4,037,245 | 7/1977 | Ferro | 357/22 |
| 4,181,542 | 1/1980 | Yoshida et al. | 29/571 |

FOREIGN PATENT DOCUMENTS 122384  10/1978  Japan ............................. 29/576 E Primary Examiner—Brian E. Hearn
Assistant Examiner—Hunter L. Auyang
Attorney, Agent, or Firm—John R. Rafter; James C. Davis, Jr.; Marvin Snyder

[57] ABSTRACT

Gate turn-off field controlled thyristors having high forward blocking capabilities and high blocking gains, and planar, junction gate field effect transistors having high source-to-drain breakdown voltage capability with high differential blocking gain, include a gate region having a plurality of vertical-walled grooves. The devices are fabricated by preferentially etching one surface of a semiconductor substrate, selectively refilling the grooves with a vapor phase epitaxial growth, forming a plurality of first electrode regions on the same surface and interdigitated with the gate region, and forming a second electrode region on the opposite surface of the substrate.

18 Claims, 11 Drawing Figures

PLANAR GATE TURN-OFF FIELD CONTROLLED THYRISTORS AND PLANAR JUNCTION GATE FIELD EFFECT TRANSISTORS, AND METHOD OF MAKING SAME

INTRODUCTION

This application is a division of application Ser. No. 355,005, filed Mar. 5, 1982, now abandoned, which is a continuation-in-part of our copending application Ser. No. 863,877, filed Dec. 23, 1977, still pending.

The present invention relates to semiconductor devices, and more particularly to an electric field controlled thyristor having a gate turn-off capability, a planar junction gate field effect transistor, and methods of making such devices.

In the area of solid state power conditioning, there is a need for semiconductor devices that can switch voltages of the order of 500 to 1000 volts and currents of 10 to 100 amperes at frequencies of greater than 15 kHz. At present, conventional bipolar devices do not meet these requirements. Electric field controlled thyristors, however, have both high frequency and high power capabilities. The basic field controlled thyristor (FCT) device includes a P-I-N structure with the I region containing a low resistivity P+ grid. The forward blocking capability of the device results from the capability to pinch off the anode-cathode current by applying a reverse bias to the grid. Additionally, for the case of a metallized grid extending to the surface of the semiconductor, gate turn-off capability can be achieved since the grid does not get debiased during grid current flow. Thus, the device can be used to switch relatively high currents in a short time by diverting the current though the grid.

Various structural configurations of FCTs are described in U.S. Pat. No. 4,037,245 to A. P. Ferro, Ser. No. 697,984 to D. Houston et al. and Ser. No. 740,027 to B. J. Baliga, of common assignee as the instant application. For the most part, the devices described in the aforementioned patent and patent applications utilize planar diffusion technology for forming the grid and cathode regions. Although these devices exhibit a gate turn-off capability, they have not exhibited a particularly desirable forward blocking gain (i.e., ratio of anode voltage to grid voltage required to prevent current flow from anode to cathode). While buried-diffused grid devices, such as those described in Vol. 12, No. 19 of *Electronics Letters*, Sept. 16, 1976, at pages 486 and 487, appear to exhibit improved blocking gain characteristics as compared to surface grid devices, the gate turn-off capability is degraded because of undesirable grid debiasing effects.

Silicon junction gate field effect transistors (FETs) may advantageously be employed as power switching devices. By exhibiting a higher input impedance than bipolar transistors and a negative temperature coefficient for drain current, which prevents thermal runaway, many such FETs may be coupled in parallel to increase current handling capability without the second breakdown problems observed in bipolar transistors. Further, junction gate field effect transistors are majority carrier devices with high switching speeds due to absence of switching losses arising from minority carrier recombination. This also obviates stringent lifetime control requirements such as are essential during fabrication of bipolar transistors.

Although many structures have been proposed for improving power and frequency performance of junction gate field effect transistors, a vertical channel arrangement, with substrate as drain region, has been shown to be the best for achieving high voltage power capability with low resistance when in the conductive condition. The blocking voltage capability of a device incorporating such structure is determined by the gate region geometry and the epitaxial layer resistivity. Gate regions can be categorized into classes, namely, surface gates and buried gates. Although a buried gate, such as described in *IEEE Transactions on Electron Devices*, Vol. ED-21, pp. 113–118 (1974) and Vol. ED-22, pp. 185–197 (1975) provides a higher blocking gain, the inability to metallize the buried gate along its entire length results in higher gate resistance and thus limits the frequency response of buried gate FETs.

It is therefore an object of this invention to provide a gate turn-off field controlled thyristor having the capability of blocking more than 1000 volts with blocking gains of between 5 and 500 while exhibiting a low forward voltage drop in the ON condition and turn-off times of less than 0.5 microseconds.

Another object of this invention is to provide a planar surface gate junction FET which is capable of providing higher blocking gain than a buried gate FET.

Another object of this invention is to provide a method of making both field controlled thyristors and field effect transistors utilizing preferential etching and vapor epitaxy refill processes which provide a high channel aspect ratio, i.e., the ratio of the channel region depth to width.

Briefly, in accordance with one preferred embodiment of the present invention, a field controlled thyristor device including a channel region having vertical walls and a depth-to-width ratio greater than unity is fabricated by using an orientation-dependent preferential etching step followed by selective vapor phase epitaxial growth of the grid regions of the device. The preferential etch and epitaxial refill technique is utilized to form a plurality of adjacently spaced, electrically interconnected grid regions of one conductivity type, interdigitated with a plurality of electrically interconnected cathode regions of opposite conductivity type on the same surface of the substrate. A uniform anode region of the one conductivity type is provided on the opposite surface of the substrate.

Electrical current flow between the anode and cathode is controlled by application of a depletion region forming voltage to the grid region to inhibit current flow from anode to cathode under forward bias conditions between anode and cathode. In absence of a depletion region forming voltage, current flows substantially unimpeded between anode and cathode.

In accordance with another preferred embodiment of the invention, a junction gate field effect transistor device including a channel region having vertical walls and a depth-to-width ratio greater than unity is fabricated by using an orientation-dependent preferential etching step followed by selective vapor phase epitaxial growth of the grid regions of the device. The preferential etch and epitaxial refill technique is utilized to form a plurality of adjacently spaced, electrically interconnected grid regions of one conductivity type, interdigitated with a plurality of electrically interconnected source regions of opposite conductivity type on the same surface of a layer of semiconductor material of the opposite conductivity type epitaxially grown on the substrate. The substrate itself constitutes a uniform drain region of the opposite conductivity type.

Electrical current flow between the FET drain and source is controlled by application of a depletion region forming voltage to the grid region to inhibit current flow from drain to source under reverse bias conditions across the pn junction at the gate boundaries. In absence of a depletion region forming voltage, current flows substantially unimpeded between drain and source.

Other objects and advantages of the invention, along with a more complete description thereof, are provided below in conjunction with the accompanying drawings in which.

Figure 9:
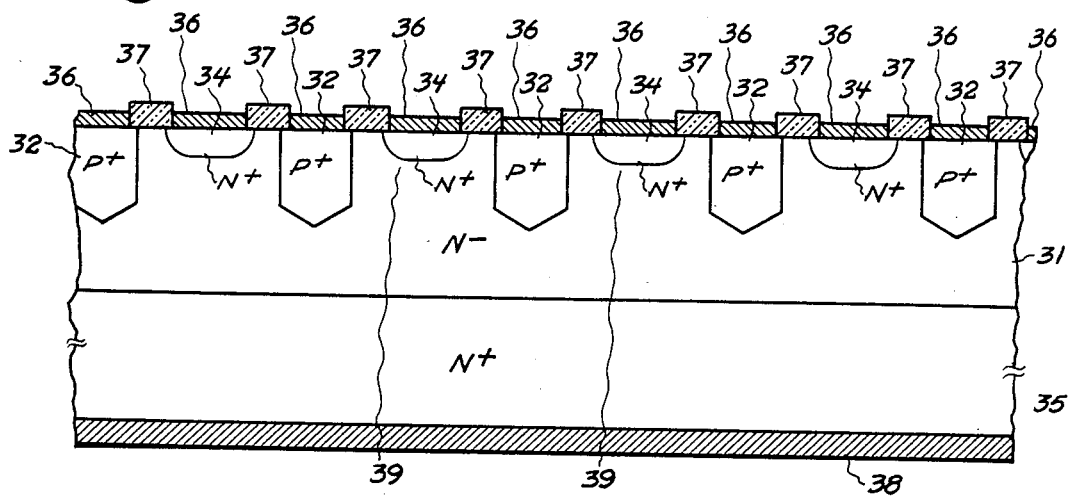
Figure 10:
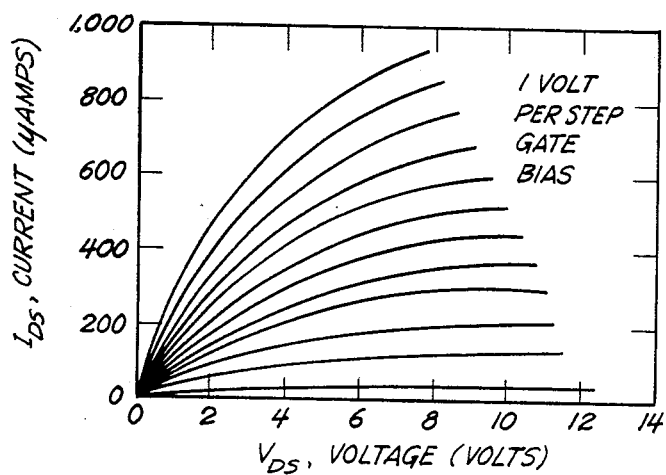
Figure 11:
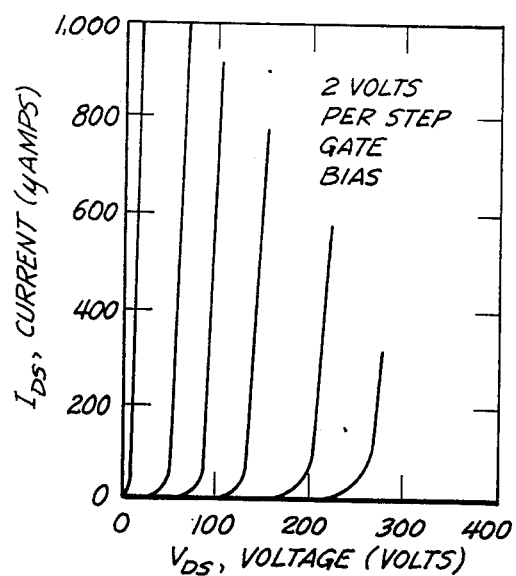

FIGS. 4 through 8 graphically illustrate typical voltage-current characteristics of a field controlled thyristor constructed in accordance with the present invention;

FIG. 9 is a partial sectional view of a completed field effect transistor constructed in accordance with a preferred process of the invention; and FIGS. 10 and 11 graphically illustrate typical voltage-current characteristics of a field effect transistor constructed in accordance with the present invention.

DESCRIPTION OF TYPICAL EMBODIMENTS

Figure 1:
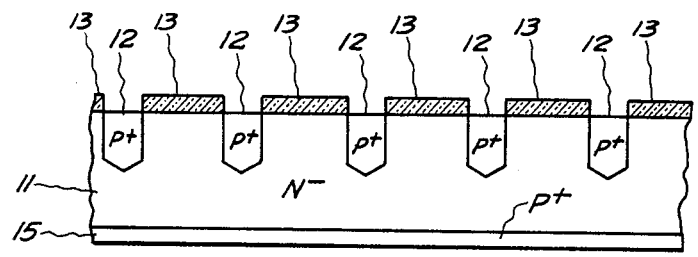
FIG. 1 is a partial sectional view illustrating the fabrication of the grid regions of a field controlled thyristor in accordance with one embodiment of the present invention.
Figure 2:
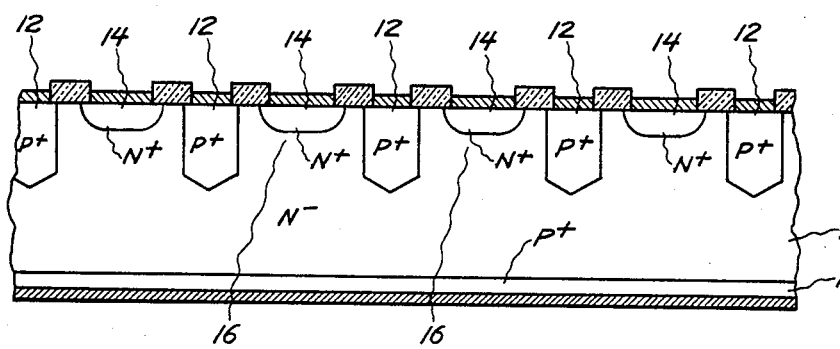
FIG. 2 is a partial sectional view of a completed field controlled thyristor constructed in accordance with a preferred process of the present invention.

FIGS. 1 and 2 illustrate, by way of example, the process for making electric field controlled thyristors in accordance with the present invention. More specifically, FIG. 1 illustrates a semiconductor substrate 11 of N− conductivity type silicon, for example, with a plurality of adjacently spaced P+ grid regions 12 extending from the surface into the substrate 11. The grid regions 12 comprise parallel elongated strips which are formed by preferentially etching deep grooves or channels into the semiconductor substrate and then refilling the grooves by a vapor phase epitaxy process, described more fully below. As illustrated in FIG. 1, the grid regions 12 exhibit substantially vertical walls defining outer boundaries of channel regions 16. The ratio of channel wall depth to channel width is defined as the aspect ratio of the channel region and, as will become more apparent from the following description, determines the forward blocking gain characteristics of the device.

In accordance with the invention, the adjacently spaced parallel grid regions 12 are oriented along a <211> direction on a <110> oriented substrate so as to minimize lateral etching during the preferential etching process. The regions for preferential etching are defined by a suitable mask 13 such as a patterned silicon dioxide layer preferably formed by thermal oxidation of the semiconductor substrate and selective etching of this silicon dioxide layer to form the pattern illustrated in FIG. 1. The unmasked portions of the surface of the substrate 11 are then subjected to the preferential etch to form the vertical walled channels. By way of example, a suitable orientation-dependent etch useful in etching the grooves or channels into the <110> oriented silicon substrate, as illustrated in FIG. 1, is a mixture of potassium hydroxide and isopropanol in a ratio of approximately 3:1. For example, this etching mixture etches the silicon at a rate of approximately five microns per hour when the mixture is maintained at approximately 60° C. Other orienatation-dependent etches may also be used in practicing the invention, if desired. For example, an article by Don L. Kendall, entitled "On Etching Very Narrow Grooves in Silicon", *Applied Physics Letters*, Vol. 26, pages 195–198 (1975) discusses suitable etchants. This article also discusses in greater detail the specific masking and etching steps, as well as the temperature and rate of etching.

By way of specific example for practicing the present invention, the grid regions 12 may be formed in a groove of approximately 12 microns width and 15 to 40 microns in depth by patterning a 10 micron "window" in the silicon dioxide masking layer 13 and etching with the aforementioned etching mixture. After etching the grooves for the grid regions, the grooves are then epitaxially refilled utilizing a vapor phase epitaxial silicon growth process which preferentially deposits into and refills the deep vertically walled grooves to produce the p+ grid regions 12. Suitable epitaxial deposition processes, for example, utilize compositions of silicon and chlorine, such as $SiCl_4$, $SiHCl_3$ and $SiH_2Cl_2$ mixed with HCl gas, to control the quality of the deposition, i.e., to minimize the number of voids in the deposited silicon. A more complete description of a suitable epitaxial deposition process is described by R. K. Smeltzer in the *Journal of Electrochemical Society*, Vol. 122, pages 1666–1671 (1975) entitled "Epitaxial Deposition of Silicon in Deep Grooves". In Smeltzer's article, however, no masking layer is employed, thus resulting in the epitaxial growth of silicon in regions between the grooves. To overcome this problem, we have developed an improved refill process.

In accordance with one embodiment of the instant invention, a layer of silicon dioxide is retained between the grooves. Additionally, by using a mixture of dichlorosilane and hydrogen chloride gas for epitaxial growth, we have found that epitaxial refill is achieved in the grooves with minimal deposits of polycrystalline silicon on the oxide. These polycrystalline silicon deposits can be minimized, while achieving epitaxial refill in the grooves, by using low dichlorosilane concentrations and high hydrogen chloride concentrations. In particular, we have found that for epitaxial refill at 1100° C., a hydrogen chloride to dichlorosilane mole ratio of about 8:1 produces minimum polycrystalline growth on the oxide coated regions of the substrates while obtaining planar epitaxial refill in the grooves. At a dichlorosilane concentration of 0.5 percent, the hydrogen carrier gas flow is approximately 20 l/min. At lower ratios, epitaxial refill is observed but with more polycrystalline silicon deposits on the oxide coated regions. At higher ratios, the polycrystalline silicon deposit decreases but the epitaxial refill in the grooves is found to contain voids and in some instances no epitaxial deposit occurs but instead vapor phase etching of the substrate is observed in the grooves. Since any polycrystalline silicon deposits between the grooves produce electrical short circuits between the grid and cathode of the completed thyristor (or between the grid and source of a completed field effect transistor when such device is being fabricated), these deposits must be removed from the oxide. Removal of the polycrystalline silicon from the oxide is achieved, for example, by selectively covering the refill deposits and etching, for example, in a mixture of three parts potassium hydroxide and one part isopropanol.

Referring now to FIG. 2, the next step in the process of making an electric field controlled thyristor in accordance with the present invention includes reoxidizing the surface of the substrate containing the grid regions and patterning the oxide by well known techniques, for example, so that the cathode regions 14 may be formed between the grid regions 12 By way of example, a shallow phosphorous diffusion (e.g., 1 to 2 microns) provides the desired N+ cathode regions.

An anode region 15 is formed on the opposite surface of the substrate by a substantially uniform surface diffusion of acceptor impurities, such as results from a boron diffusion. Obviously, those skilled in the art can readily appreciate that the anode region 15 may, if desired, be formed simultaneously with the p+ grid regions 12, thereby avoiding an additional diffusion step.

Electrical contact is made to the grid and cathode regions by well known metallization and etching techniques. An anode contact to the anode region 15 may be subsequently formed by evaporating aluminum onto the anode region.

Figure 3:
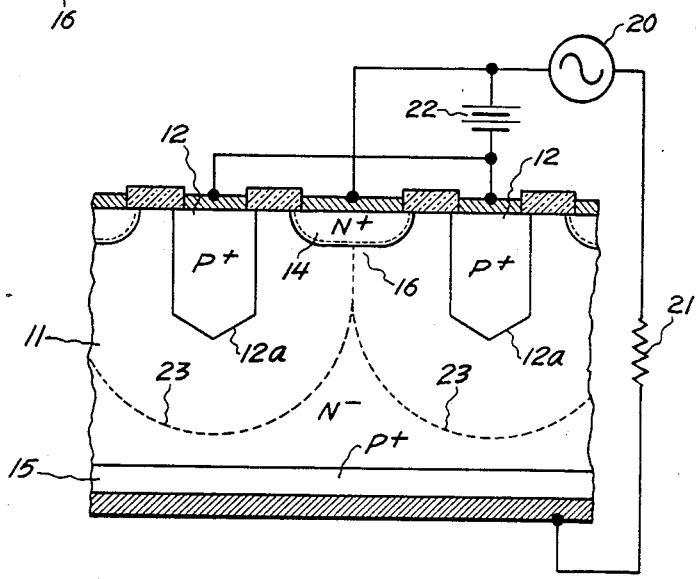
FIG. 3 is a partial sectional view of a field controlled thyristor constructed in accordance with the present invention and illustrating the effects of electrical biasing on the thyristor.

Operation of the thyristor fabricated in accordance with the present invention is best illustrated in FIG. 3 in which only two adjacent grid regions 12 are illustrated with a cathode region 14 disposed therebetween. As illustrated in FIG. 2, the grid regions 12 are electrically connected together and to the negative terminal of a voltage source 22, the positive terminal of which is connected to the cathode region 14. The voltage source 22, as will be described more fully below, controls the flow of current between the anode and cathode regions of the thyristor and the series connected voltage source 20 and the load impedance 21.

When the polarity of the voltage source 20 is positive on the anode 15 relative to the cathode 14, and little or no voltage applied to the gate region 12, current flows from the source 20 through the load impedance 21 to the anode region 15, through the body of the semiconductor substrate 11 and to the cathode region 14, and then back to the voltage source 20. Current flow in this mode of operation is substantially unimpeded by any electric field effects in the device and the device functions substantially as a P-I-N diode. Upon application of a grid or gate voltage from the source 22, a depletion region 23 forms around each grid region 12 because the grid-substrate junction 12a becomes reverse biased. As the magnitude of the depletion region 23 increases, adjacent depletion regions in the channel 16, as illustrated in FIG. 3, and cause current flow from anode to cathode to be "pinched off". This mode of operation is referred to as the forward blocking mode since current flow is blocked by the reverse biased gate-substrate junction 12a.

The magnitude of the voltage required between the gate and cathode to prevent current flow between anode and cathode in the forward blocking mode is a factor 1/G times the applied forward bias between anode and cathode. As can be readily appreciated by those skilled in the art, the value of G varies with the geometry of the thyristor, as well as the doping profile of the device. A particularly desirable characteristic of the electric field controlled thyristors constructed in accordance with the present invention is the small voltage required at the grid-cathode region to produce a large voltage blocking capability between the anode and cathode regions. More specifically, because of the geometry of the device in which the channel regions 14a exhibit vertical, parallel-plate walls with an aspect ratio (depth to width) of approximately unity, high gain factors ranging between 5 and 500 are achievable.

Figure 4:
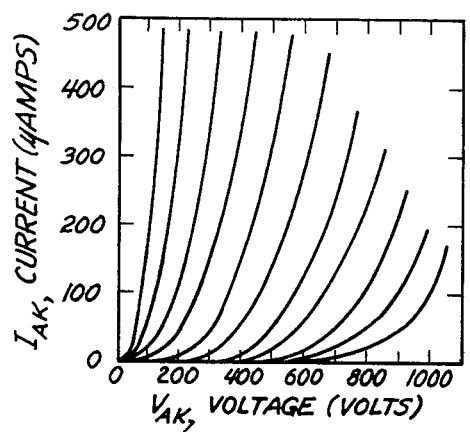

Some of the more important voltage-current characteristics of typical electrical field controlled devices constructed in accordance with the instant invention are illustrated in FIGS. 4 through 8. In particular, FIG. 4 illustrates the anode-cathode current-voltage characteristics ($I_{AK}$-$V_{AK}$) of a field controlled thyristor in the forward blocking state. It can be seen that the forward blocking voltage capability of this device is approximately 1030 volts at a leakage current of approximately 100 microamperes. This particular device, having an aspect ratio of approximately unity, requires a reverse bias voltage between grid and cathode of approximately 32 volts to provide the 1030 volts blocking voltage exhibited in FIG. 4. It should be noted that, whereas a d-c blocking gain of approximately 33 exists for the device, the a-c blocking gain is found to be greater than 50. In fact, the a-c blocking gain of the thyristor is dependent upon the anode-cathode voltage and varies as $V_{AK}^{0.66}$.

Figure 5:
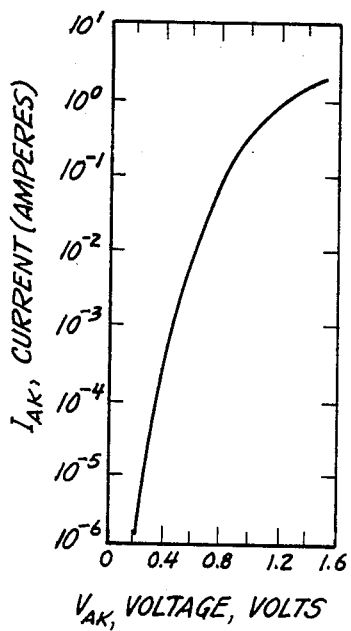

The forward conduction characteristics (i.e., when the grid is not biased) are shown in FIG. 5. It should be noted that the characteristics are similar to those of a P-I-N diode in which the forward voltage drop $V_{AK}$ at one ampere of current flow, $I_{AK}$, which corresponds to approximately 180 amperes per square centimeter at the cathode, is approximately 1.24 volts.

Figure 6:
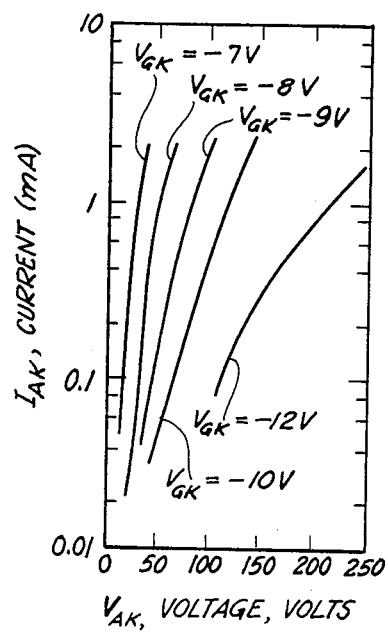
Figure 7:
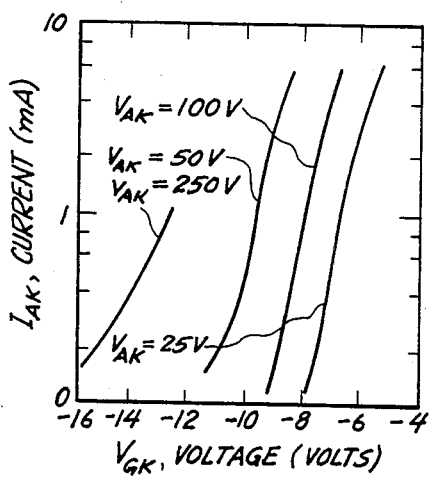

FIG. 6 is a semilogarithmic plot of the anode-cathode current $I_{AK}$ versus anode-cathode voltage $V_{AK}$ for constant grid bias voltages $V_{GK}$, as illustrated. Of particular interest is the fact that nearly exponential dependence of anode current on anode-cathode voltage exists. As the grid bias becomes more negative, the slope of the curves decreases as a result of increasing gain. Similarly, a semilogarithmic plot of anode current versus grid bias $V_{GK}$ yields characteristics that are nearly linear for low values of $V_{AK}$ as illustrated in FIG. 7.

It should be noted that the static current-voltage characteristics illustrated in the drawings are consistent with current flow through a potential barrier which arises from the formation of the depletion region under the cathode as a result of a reverse bias applied to the grid region. More particularly, the potential barrier $V_b$ is a function of both the anode-cathode voltage, $V_{AK}$, and the grid bias voltage, $V_{GK}$, and is given by $$V_b = \eta \cdot V_{GK} + \eta/\mu \cdot V_{AK},$$

where
$\eta$ is the internal grid factor and
$\mu$ is the external blocking gain of the thyristor.
Based upon the injection over the potential barrier, the current through the device can be approximated by $$I_{AK} = I_o \exp \frac{qV_b}{kT}.$$

Thus, $$I_{AK} = I_o \exp \frac{q\eta}{kT} \left( V_{GK} + \frac{V_{AK}}{\mu} \right).$$

These equations demonstrate that the anode-cathode current should increase exponentially with increasing anode voltage at any fixed grid bias voltage. Also, the current should increase exponentially with decreasing grid bias voltage at any fixed anode voltage. This, in fact, is the observed behavior in FIGS. 6 and 7, respectively.

Whereas the foregoing discussion relates to static characteristics, the dynamic characteristics of gate turn-off capability of the thyristor are demonstrated by applying a pulse of forward current between anode and cathode and turning off this current flow by the application of a negative grid bias after the forward current has reached its steady-state condition. Defining the turn-off time as the time taken for the anode current to fall below 5% of its steady-state value after the application of a grid bias voltage, it can be appreciated that the turn-off time varies with the magnitude of the anode current, as well as the anode voltage to be blocked after turn-off.

Figure 8:
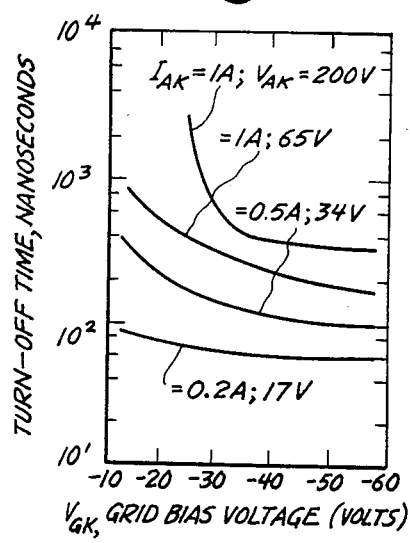

FIG. 8 illustrates the variation of turn-off time with anode current and voltage. It can be seen that the turn-off time increases with increasing anode current and voltage and decreases with increasing grid bias voltage.

By way of comparison, thyristors constructed in accordance with the present invention exhibit a much higher blocking gain G and a much faster switching speed, when compared with conventional planar diffused thyristors. For example, whereas only a 32 volt grid bias is required to block more than 1000 volts in the devices described herein, more than 150 volts is necessary to block 650 volts for the planar diffused thyristor. Additionally, the gate turn-off capability of devices constructed in accordance with the present invention are in the fractional microsecond region, as opposed to several microseconds for the planar diffused thyristors. Accordingly, electric field-controlled thyristors constructed in accordance with the present invention exhibit substantially improved characteristics over the planar diffused thyristor.

A planar, junction gate field effect transistor fabricated in a manner similar to that described, supra, for the field effect thyristor, is illustrated in FIG. 9. This device is analogous to the field controlled thyristor illustrated in FIG. 2, with the exception that the relatively thin P+ anode region 15 of the thyristor is replaced by a relatively thick N+ drain region. The transistor provides high blocking gain and better frequency response than field effect transistors having buried gate structures.

The high blocking gain of the silicon transistor shown in FIG. 9 is achieved by forming steep vertical walled channel regions 39 to provide the necessary high channel aspect ratio. The adjacently spaced parallel gate regions 32 are oriented along a <211> direction in an N− type epitaxial layer 31 grown on a <110> oriented, heavily doped, N+ type substrate 35. The vertical walled grooves in which the gate regions 32 are situated are typically formed by the same preferential etching process described for the field controlled thyristor of the invention, resulting in the same dimensions of width, depth, and spacings for an epitaxial layer 31 of 40 microns thickness doped to a concentration of $2 \times 10^{14}$ cm$^{-3}$. This is followed by a dichlorosilane epitaxial refill, as with boron-doped silicon, to form the upper, planar surface of the device in the manner described for the field controlled thyristor of the invention. N+ source regions 34 are then formed between gate regions 32, as by diffusion of phosphorous to a depth of, for example, 1 to 2 microns into epitaxial layer 31. N+ substrate 35 constitutes the drain region of the device and, typically, may be antimony-doped and 250 microns thick. The transistor is then metallized with regions 36 between silicon dioxide regions 37 and with region 38 on the outer major surface of layer 35 to complete the structure shown in FIG. 9. For field effect transistors fabricated with the parameters given in the preceding example, a blocking voltage of more than 200 volts can be obtained with an applied gate bias of 30 to 40 volts. Typical characteristics for one such device are shown in FIG. 10, with an on-resistance (i.e., drain-to-source resistance) being approximately 12 ohms for a device with 60 channels.

Field effect transistors fabricated in the aforementioned manner exhibit pentode type characteristics such as illustrated in FIG. 10 at low gate bias voltages for a 20 ohm-cm resistivity substrate, since the zero bias gate depletion layer width for such substrate is less than 3 microns, resulting in saturation of drain-to-source current at the higher drain-to-source voltages. However, at higher gate bias voltages (i.e., greater than 20 volts), such transistors have been found to exhibit triode characteristics, of the type illustrated in FIG. 11. In general, therefore, exclusively triode type characteristics occur if the zero bias gate depletion width is greater than half the gate spacing, while pentode type characteristics are exhibited when punch-through of the gate depletion layer does not occur in the channel region. A differential blocking gain of more than 30 is attained by this field effect transistor, due to the steep vertical gate walls which provide better depletion layer punch-through in the channel and which retard penetration of the drain potential into the channel region. Additionally, the transistor structure has a planar surface, eliminating serious problems associated with metal discontinuities occurring at the edges of previous nonplanar (V-groove) device structures.

It will be apparent to those skilled in the art that various modifications and changes may be made within the spirit and scope of the invention as described. For example, various structural arrangements of interdigitated grid and cathode regions are possible, as well as complementary device structures. Accordingly, the appended claims are intended to cover all such modifications and variations.

What is claimed is:

1. A method of fabricating an electric field controlled thyristor device including cathode and grid regions in one major surface and an anode region in the opposite major surface, said method comprising:

selectively etching a plurality of elongated grooves in a semiconductor substrate of one conductivity type;

epitaxially refilling said grooves with an opposite conductivity type semiconductor material, the refilled grooves forming said grid regions and defining channels with high aspect ratio;

diffusing a plurality of elongated one conductivity type regions into the surface of the semiconductor substrate containing the epitaxially refilled grooves, said plurality of diffused regions interdigitated with said plurality of grooves forming said grid regions and forming said cathode;

diffusing a substantially uniform region of opposite conductivity type in said opposite major surface, said uniform region of opposite conductivity type forming said anode region; and forming metallized contacts to said anode, cathode and grid regions.

2. The method of claim 1 wherein the step of etching includes:

masking selected regions on the surface of said semiconductor substrate; and etching the unmasked surface of said substrate with an orientation-dependent etch.

3. The method of claim 2 wherein said substrate is silicon and said orientation-dependent etch is a mixture of potassium hydroxide and isopropanol.

4. The method of claim 3 wherein the step of epitaxially refilling said grooves includes:

vapor depositing said semiconductor material from a vapor phase composition containing silicon and chlorine.

5. The method of claim 4 wherein said composition is selected from the group consisting of $SiCl_4$, $SiHCl_3$ and $SiH_2Cl_2$ 6. The method of claim 4 wherein said composition comprises HCl and $SiH_2Cl_2$ in a mole ratio of approximately 8:1.

7. The method of claim 6 wherein said substrate comprises N-conductivity type, said grid and anode regions are of P conductivity type and said cathode region is of N conductivity type but of higher conductivity than said substrate.

8. The method of claim 7 wherein the step of forming metallized contacts includes depositing aluminum on said one surface and photolithographically defining contacts to said grid and cathode regions.

9. The method of claim 2 wherein each of said plurality of channels has a depth-to-width ratio greater than unity.

10. A method of fabricating an electric field effect transistor device including source and grid-type gate regions in one major surface and a drain region in the opposite major surface, said method comprising:

epitaxially growing, atop a semiconductor substrate heavily doped to one type conductivity so as to constitute a drain region, a semiconductor layer of said one type conductivity;

selectively etching a plurality of elongated grooves in said layer of epitaxially deposited semiconductor material;

epitaxially refilling said grooves with an opposite conductivity type semiconductor material, the refilled grooves forming said gate regions and defining channels with high aspect ratio;

diffusing a plurality of elongated regions of said one type conductivity into the surface of the epitaxially-deposited semiconductor layer such that said plurality of diffused regions is interdigitated with said plurality of grooves said source region; and forming metallized contacts to said source, drain and gate regions.

11. The method of claim 10 wherein the step of etching includes:

masking selected regions on the surface of said epitaxially-deposited semiconductor layer; and etching the unmasked surface of said epitaxially-deposited semiconductor layer with an orientation-dependent etch.

12. The method of claim 11 wherein said substrate comprises silicon and said orientation-dependent etch comprises a mixture of potassium hydroxide and isopropanol.

13. The method of claim 12 wherein the step of epitaxially refilling said grooves comprises:

vapor depositing said semiconductor materials from a vapor phase composition containing silicon and chlorine.

14. The method of claim 13 wherein said composition is selected from the group consisting of $SiCl_4$, $SiHCl_3$ and $SiH_2Cl_2$.

15. The method of claim 13 wherein said composition comprises HCl and $SiH_2Cl_2$ in a mole ratio of approximately 8:1.

16. The method of claim 15 wherein said source and drain regions comprise N-conductivity type semiconductor material, said gate region comprises P-conductivity type semiconductor material, and said epitaxially-deposited layer is of N-conductivity type semiconductor material but of lower conductivity than either of said source and drain regions.

17. The method of claim 16 wherein the step of forming metallized contacts includes depositing aluminum on the exposed major surface of said substrate and photolithographically defining contacts to said grid and source regions.

18. The method of claim 11 wherein each of said plurality of channels has a depth-to-width ratio of greater than unity.

* * * * *